United States Patent [19]
Iwasaki

[11] Patent Number: 6,116,841
[45] Date of Patent: Sep. 12, 2000

[54] SUBSTRATE TRANSFERRING APPARATUS AND SUBSTRATE PROCESSING APPARATUS USING THE SAME

[75] Inventor: Tatsuya Iwasaki, Kumamoto, Japan

[73] Assignee: Tokyo Electron Limited, Tokyo, Japan

[21] Appl. No.: 09/121,579

[22] Filed: Jul. 24, 1998

[30] Foreign Application Priority Data

Jul. 30, 1997 [JP] Japan .................................. 9-218362

[51] Int. Cl.[7] .................................................. B65G 49/07
[52] U.S. Cl. ............................ 414/416; 414/937; 901/16
[58] Field of Search ................................ 414/744.3, 749, 414/935, 937, 749.1, 416; 901/16

[56] References Cited

U.S. PATENT DOCUMENTS

| | | | |
|---|---|---|---|
| 4,229,136 | 10/1980 | Panissidi ............................... | 901/16 X |
| 4,735,548 | 4/1988 | Kimata et al. ...................... | 414/749 X |
| 4,770,590 | 9/1988 | Hugues et al. ..................... | 414/744.3 X |
| 4,882,881 | 11/1989 | Van Kuiken, Jr. et al. .......... | 901/16 X |
| 4,972,731 | 11/1990 | Akutagawa et al. ................. | 901/16 X |
| 5,099,707 | 3/1992 | Tori et al. ............................ | 901/16 X |
| 5,540,098 | 7/1996 | Ohsawa ............................... | 414/937 X |
| 5,611,655 | 3/1997 | Fukasawa et al. .................... | 414/217 |
| 5,695,562 | 12/1997 | Mizosaki .............................. | 118/712 |
| 5,700,127 | 12/1997 | Harada et al. ....................... | 414/937 X |
| 5,826,129 | 10/1998 | Hasebe et al. ...................... | 414/416 X |
| 5,881,603 | 3/1999 | Kitamura ........................... | 414/744.3 X |
| 5,915,916 | 6/1999 | Saji ....................................... | 414/749 |

FOREIGN PATENT DOCUMENTS

| | | | |
|---|---|---|---|
| 232194 | 9/1990 | Japan ................................ | 414/744.3 |
| 4013595 | 1/1992 | Japan ................................ | 414/744.3 |
| 4115884 | 4/1992 | Japan ..................................... | 901/16 |
| 5-49290 | 6/1993 | Japan . | |
| 8-293534 | 11/1996 | Japan . | |

*Primary Examiner*—James W. Keenan
*Attorney, Agent, or Firm*—Oblon, Spivak, McClelland, Maier & Neustadt, P.C.

[57] ABSTRACT

A substrate transferring apparatus comprising a substrate support member for supporting a substrate, a base member for holding the substrate support member to be movable horizontally, a lifting member, having one end and another end, for holding the base member at the one end to be rotatable in a horizontal plane, the lifting member being movable upward and downward, and a hold-and-guide member for holding the lifting member at the another end and for guiding the lifting member when the lifting member is moved upward and downward.

16 Claims, 5 Drawing Sheets

SUBSTRATE TRANSFERRING APPARATUS AND SUBSTRATE PROCESSING APPARATUS USING THE SAME

BACKGROUND OF THE INVENTION

The present invention relates to a substrate transferring apparatus for transferring a large-sized substrate such as an LCD substrate, and to a substrate processing apparatus using the substrate transferring apparatus.

In the manufacture of liquid crystal displays (LCD), a circuit pattern is formed by the so-called lithography technique. That is, the LCD substrate, made of glass, is coated with photo resist liquid to form a resist film, the resist film is exposed to a pattern correspond to the circuit pattern, and the LCD substrate is developed to form the circuit pattern thereon.

Conventionally, a series of coating/developing processes is carried out by a system in which the respective processing apparatus are incorporated. Such a system comprises processing units for performing the respective processes such as a cleaning process, a coating process, a developing process and a heating process, and a cassette station on which a cassette for containing a plurality of substrates is mountable. A substrate transferring apparatus is provided between the cassette station and a transferring mechanism of each processing unit to receive and transfer the substrate.

Such a substrate transferring apparatus is structured to be movable on a carrying path formed along the plurality of cassettes arranged in parallel in the cassette station. The substrate transferring apparatus comprises a support member, which is called tweezers, for supporting the substrate, a base member for supporting the support member to be movable back and forth, a lifting member, provided to be movable upward and downward, for supporting the base member to be rotatable in a horizontal plane, and a hold-and-guide member, formed on both sides of the lifting member, for supporting and guiding the lifting member when the lifting member moves up and down. The hold-and-guide member is structured such that its upper end is always positioned at a lower portion of the base member not to prevent the rotation of the base member.

By the way, the need for enlarging the size of the LCD substrate has recently been increased more and more. Specifically, there has been needed the size of the substrate, which is greatly enlarged, for example, 830×650 mm from the conventional size of 650×550 mm. If the size of the substrate is greatly increased, an amount of deflection of the substrate is increased in the cassette. Therefore, the distance between substrates in the cassette must be increased. From the viewpoint of improvement of throughput, the number of substrates to be contained in one cassette must be maintained. Therefore, the height of the cassette is increased, the motion strokes of the lifting member of the substrate transfer mechanism is increased. In this case, the upper end of the hold-and-guide member is positioned at the lower portion of the base member. For this reason, the upper end position is adjusted to a position where the rotation of the base member is prevented in receiving/transferring the substrate from/to the lower stage of the cassette. As a result, there emerges a need for reducing the lower end position of the guide and support member to be lower than a floor surface. This forces a user to do additional work, unfavorably. Also, if the hold-and-guide member is structured to be projectable upward than the base member in order that the base member is rotatable, the transferring apparatus itself will be extremely enlarged.

BRIEF SUMMARY OF THE INVENTION

An object of the present invention is to provide a substrate transferring apparatus, which can deal with an increase in motion strokes of a lifting member without providing additional work and enlarging the size of the apparatus when transferring a large-sized substrate, and to provide a substrate processing apparatus using the substrate transferring apparatus.

According to a first aspect of the present invention, there is provided a substrate transferring apparatus comprising:
   a substrate support member for supporting a substrate;
   a base member for holding the substrate support member to be movable horizontally;
   a lifting member, having one end and another end, for holding the base member at the one end to be rotatable in a horizontal plane, the lifting member being movable upward and downward; and
   a hold-and-guide member for holding the lifting member at the another end and for guiding the lifting member when the lifting member is moved upward and downward.

According to a second aspect of the present invention, there is provided a substrate transferring apparatus comprising:
   a substrate support member for supporting a substrate;
   a base member for holding the substrate support member to be movable horizontally;
   a first driving mechanism, provided in the base member, for linearly driving the support member;
   a lifting member, having one end and another end downward, for supporting the base member to be rotatable in a horizontal plane, the lifting member being movable upward and downward;
   a second driving mechanism, provided in the lifting member, for rotably driving the base member;
   a hold-and-guide member for holding the lifting member at the another end and for guiding the lifting member when the lifting member is moved upward and downward; and
   a third driving mechanism for driving upward and downward the lifting member.

According to a third aspect of the present invention, there is provided a substrate processing apparatus for providing a predetermined process to a substrate to be processed, comprising:
   a processing section for providing the predetermined process to the substrate to be processed; and
   a substrate transferring apparatus for receiving and transferring the substrate between a substrate carrying in/out section or the other apparatus and the processing section;
   the substrate transferring apparatus comprising:
      a substrate support member for supporting the substrate;
      a base member for holding the substrate support member to be movable horizontally;
      a lifting member, having one end and another end, for holding the base member at the one end to be rotatable in a horizontal plane, the lifting member being movable upward and downward; and
      a hold-and-guide member for holding the lifting member at the another end and for guiding the lifting member when the lifting member is moved upward and downward.

According to a fourth aspect of the present invention, there is provided a substrate processing apparatus for providing a predetermined process to a substrate to be processed, comprising:

a processing section for providing the predetermined process to the substrate to be processed; and a substrate transferring apparatus for receiving and transferring the substrate between a substrate carrying in/out section or the other apparatus and the processing section;

the substrate transferring apparatus comprising:

a substrate support member for supporting the substrate;

a base member for holding the substrate support member to be movable horizontally;

a first driving mechanism, provided in the base member, for linearly driving the support member;

a lifting member, having one end and another end downward, for supporting the base member to be rotatable in a horizontal plane, the lifting member being movable upward and downward;

a second driving mechanism, provided in the lifting member, for ratably driving the base member;

a hold-and-guide member for holding the lifting member at the another end and for guiding the lifting member when the lifting member is moved upward and downward; and a third driving mechanism for driving upward and downward the lifting member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments according to the present invention will now be specifically described with reference to the accompanying drawings.

Figure 1:
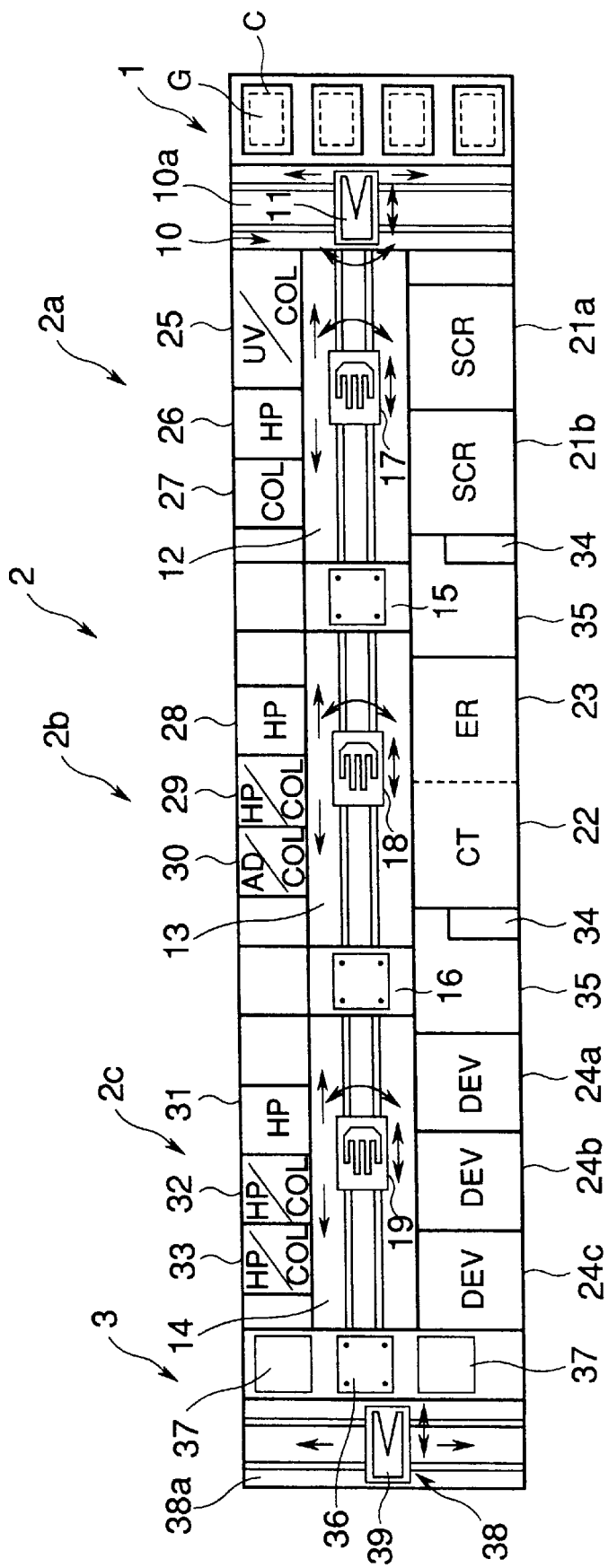
FIG. 1 is a perspective view showing a resist coating/developing system to which the substrate transferring apparatus of the present invention is applied.

FIG. 1 is a plan view showing an LCD substrate coating/developing process system.

The coating/developing process system comprises a cassette station 1 in which a cassette C holding a plurality of substrates G therein is loaded, a processing section 2 including a plurality of processing units which apply a series of processes including coating/developing of resist to the substrates G, and an interface portion 3 for transferring the substrate G between the coating/developing process system and an exposure unit (not shown). The cassette station 1 and the interface portion 3 are respectively provided to one end and the other end of the processing section 2.

The cassette station 1 comprises a transferring section 10 for transferring an LCD substrate between the cassette C and the processing section 2. Loading/unloading the cassette C is carried out into/from the cassette station 1. The transferring section 10 comprises transferring apparatus 11 which is movable on transferring paths 10a provided along an alignment direction of the cassettes C, and the substrate G can be carried between the cassette C and the processing section 2 by virtue of the transferring apparatus 11.

The processing section 2 is divided into a front stage portion 2a, an intermediate stage portion 2b, and a rear stage portion 2c, in which transferring paths 12, 13, 14 are provided in their central areas respectively and processing units are arranged on both sides of these transferring paths respectively. Relay portions 15, 16 are provided between the front stage portion 2a, the intermediate stage portion 2b, and the rear stage portion 2c respectively.

The front stage portion 2a comprises a main transferring apparatus 17 which is movable along the transferring path 12. Two cleaning units (SCR) 21a, 21b are provided to one end side of the transferring path 12, while a ultraviolet irradiating/cooling unit (UV/COL) 25 and a heating process unit (HP) 26 and a cooling unit (COL) 27, both being stacked as two upper and lower stages respectively, are provided to the other end side of the transferring path 12.

The intermediate stage portion 2b comprises a main transferring apparatus 18 which is movable along the transferring path 13. A resist coating process unit (CT) 22 and a peripheral resist removing unit (ER) 23 which can remove the resist coated on the peripheral portion of the substrate G are provided integrally to one end side of the transferring path 13, whereas heating process units (HP) 28 which are stacked as two stages vertically, a heating/cooling process unit (HP/COL) 29, in which the heating process unit and the cooling process unit are stacked vertically, and an adhesion/cooling process unit (AD/COL) 30, in which an adhesion process unit and a cooling unit are stacked vertically, are provided to the other end side of the transferring path 13.

The rear stage portion 2c comprises a main transferring apparatus 19 which is movable along the transferring path 14. Three developing process units 24a, 24b, 24c are provided to one end side of the transferring path 14, while heating process units 26, which are stacked as two stages vertically, and two heating/cooling process units (HP/COL) 32, 33, in which a heating process unit and a cooling process unit are vertically stacked respectively, are provided to the other end side of the transferring path 14.

It is apparent from FIG. 1, the processing section 2 is so constructed that spinner system units such as a cleaning process unit 21a, a resist process unit 22a, a developing process unit 24a, etc. are arranged on one side of the transferring path, while only thermal system process units such as the heating process unit, the cooling process unit, etc. are arranged on the other side of the transferring path.

Chemical liquid supply units 34 and spaces 35 for loading and unloading of the main transferring apparatus are arranged at the spinner system units side of relay portions 15, 16.

The interface portion 3 comprises an extension 36 for holding the substrate temporarily when the substrate is transferred/received to/from the processing section 2, two buffer stages 37 which are provided on both sides of the extension 36 and in which buffer cassettes are arranged, and a transferring mechanism 38 for transferring the substrate G between the extension 36/two buffer stages 37 and an exposure unit (not shown). The transferring mechanism 38 includes a transferring arm 39 which is movable on transferring paths 38a provided along the alignment direction of the extension 36 and the buffer stages 37. The substrate G can be carried between the processing section 2 and the exposure unit by the transferring arm 39.

Like the above, space saving and improvement in the efficiency of the process can be achieved by incorporating respective process units together.

In the coating/developing process system as constructed above, the substrate G in the cassette C is carried into the processing section 2. Then, in the processing section 2, first the substrate G is subjected to surface modifying/cleaning process in the ultraviolet irradiating/cooling unit (UV/COL) 25 and then to scriber cleaning process in the cleaning units (SCR) 21a, 21b after the substrate has been cooled, then is dried by heating operation in the heating process unit (HP) 26, and then is cooled in the cooling unit (COL) 27.

After this, the substrate G is carried to the intermediate stage portion 2b and then to hydrophobicity process (HMDS process) in the upper stage adhesion process unit (AD) of the unit 30 in order to enhance a fixing property of the resist. Then, the substrate G is cooled in the cooling unit (COL) and then coated with the resist in the resist coating unit (CT) 22. Then, extra resist on the peripheral portion of the substrate G is removed in the peripheral resist removing unit (ER) 23. Then, the subject G is subjected to prebake process in the heating process unit (HP) in the intermediate stage portion 2b and then is cooled in the lower stage cooling unit (COL) in the unit 29 or 30.

Thereafter, the substrate G is carried by the main transferring apparatus 19 from the relay portion 16 to the exposure unit via the interface portion 3, and then predetermined patterns are exposed on the substrate G. Then, the substrate G is carried again via the interface portion 3 and then is developed in any of the developing process units (DEV) 24a, 24b, 24c to form predetermined patterns thereon. The developed substrate G is subjected to postbake process in any of the heating process unit (HP), then is cooled in the cooling unit (COL), and then is put in the predetermined cassette on the cassette station 1 by virtue of the main transferring apparatus 19, 18, 17 and the transferring apparatus 11.

Figure 2:
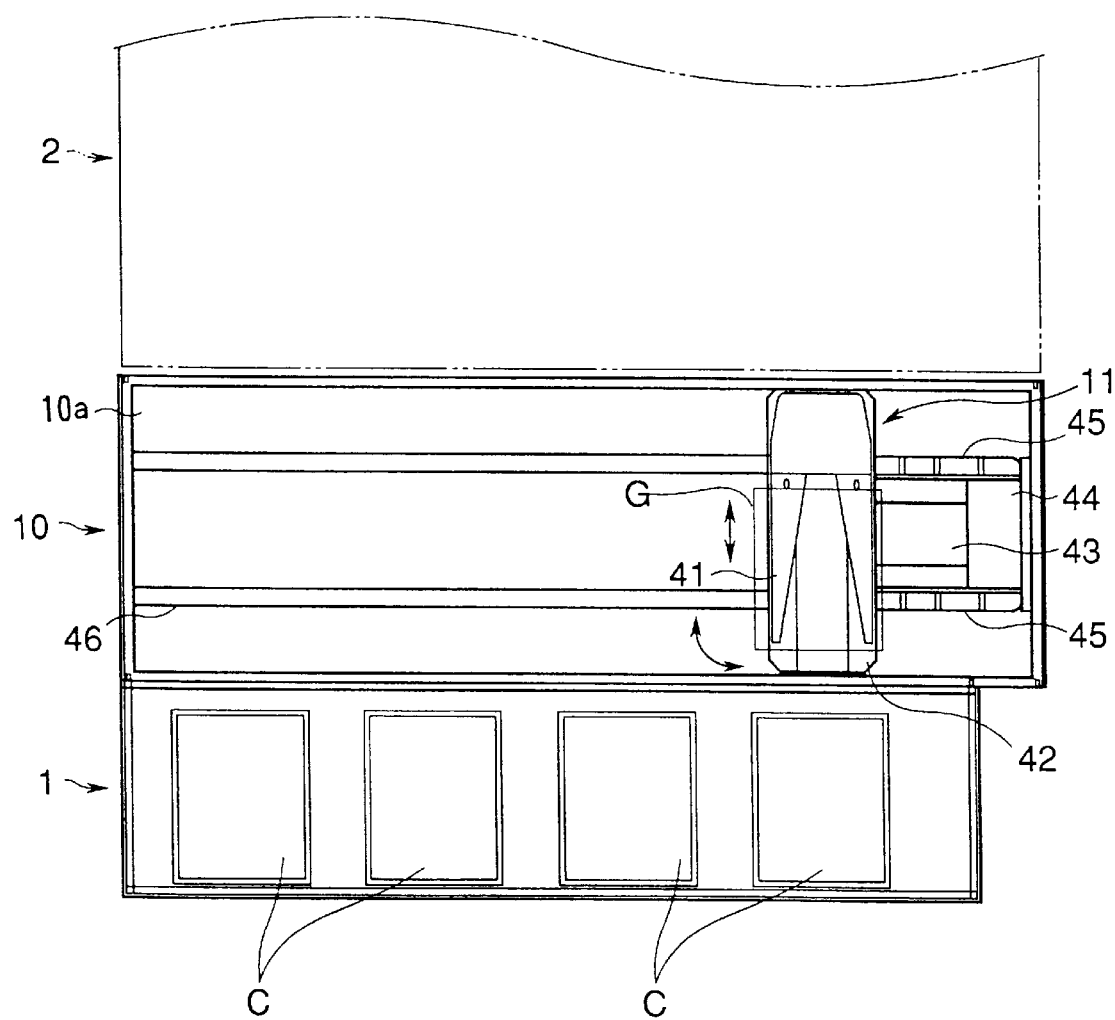
FIG. 2 is a plane view showing an arranging state of a transferring apparatus of a receiving/transferring section in the coating/developing system of FIG. 1.
Figure 3:
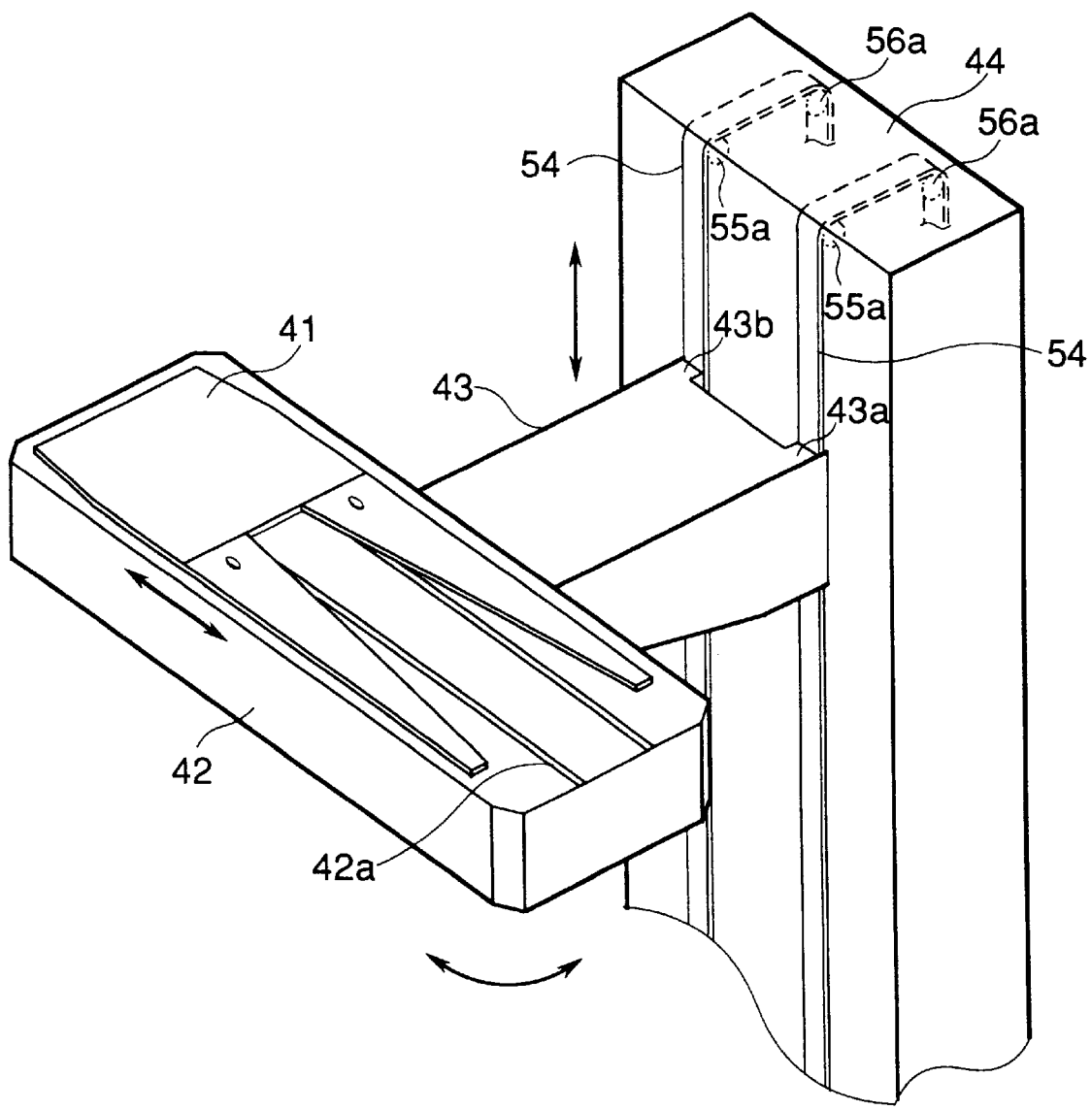
FIG. 3 is a perspective view showing an arranging state of a transferring apparatus of a receiving/transferring section in the coating/developing system of FIG. 1.
Figure 4:
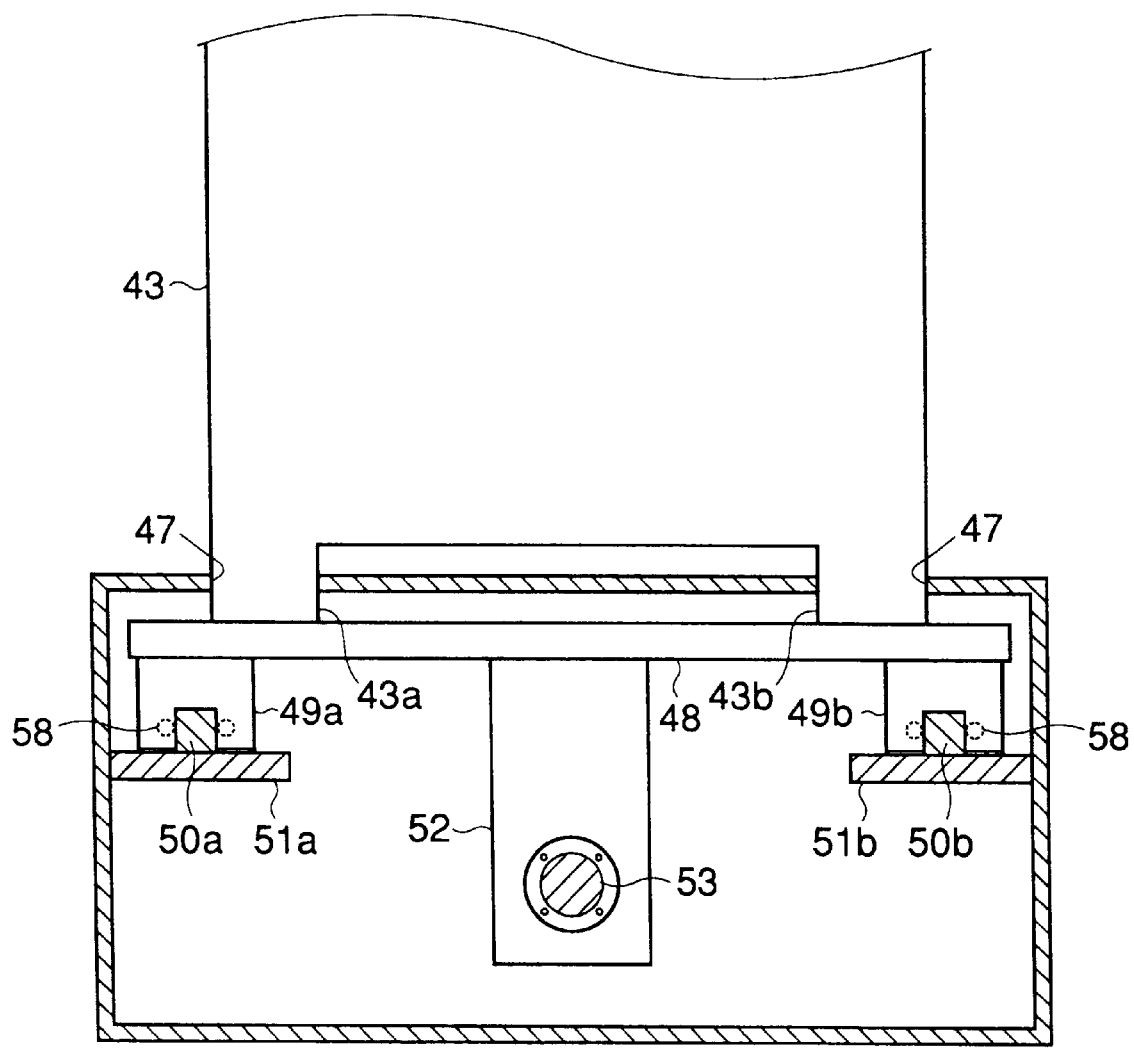
FIG. 4 is a horizontal cross sectional view showing an arranging state of a transferring apparatus of a receiving/transferring section in the coating/developing system of FIG. 1.
Figure 5:
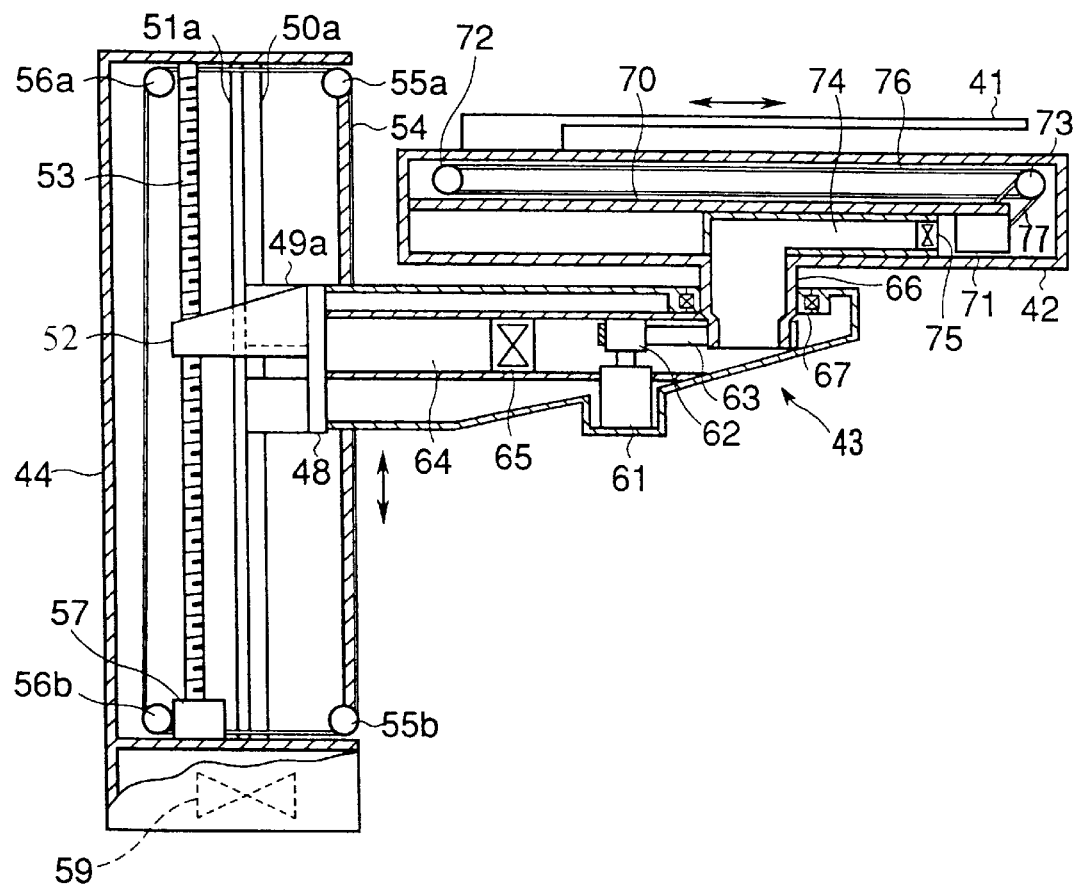
FIG. 5 is a vertical cross sectional view showing an arranging state of a transferring apparatus of a receiving/transferring section in the coating/developing system of FIG. 1.

Next, the following will specifically explain the transferring apparatus 11 in the receiving/transferring section 10 of cassette station 1 with reference to FIGS. 2 to 5. FIG. 2 is a plane view showing an arranging state of the transferring apparatus 11 of the transferring section 10, FIG. 3 is a perspective view of the transferring section 10, FIG. 4 is a horizontal cross sectional view thereof, and FIG. 5 is a vertical cross sectional view thereof.

As shown in FIG. 2, the transferring apparatus 11 is movable along the carrying path 12. The transferring apparatus 11, as shown in FIG. 3, comprises a substrate support member 41, a base member 42, a lifting member 43, and a hold-and-guide member 44. The substrate support member 41 supports the substrate G to receive and transfer the substrate G. The base member 42 supports the substrate support member 41 to be movable back and forth in a horizontal plane. The lifting member 43, which is provided to be movable up and down, supports the base member 42 to be rotatable in a horizontal plane. The hold-and-guide member 44 supports the lifting member 43 in its single support state, and guides the lifting member 43 at the time of moving up and down the lifting member 43.

As shown in FIG. 2, the hold-and-guide member 44 can be moved on the carrying path 10a by a driving apparatus (not shown) in a state in which a leg portion 45 is guided by a rail 46 provided on the carrying path 12. Then, the hold-and-guide member 44 is moved to the position of a predetermined cassette C, so that the substrate G is loaded and unloaded on/from the cassette C. Also, the hold-and-guide member 44 is moved to a position of the main transferring mechanism 17, so that the substrate G is received and transferred between the main transferring mechanism 17 and the processing section 2.

In the drive control of the up and down motion of the lifting member 43, that of the rotation of the base member 42, and that of the back and forth motion of the substrate support member 41, there is used the so-called S-shape driving control method to transfer a large-sized substrate with high throughput and high transfer stability. The S-shape driving control method is that the driving velocity is changed to describe an S-shape at the operation starting and stopping time instead of linear driving. Also, from a viewpoint of the improvement of throughput, there is used the so-called pass-operation in which a next operation started before one operation is completed. Moreover, from a viewpoint of transfer stability, multishaft synchronization and auto-acceleration are used. The multishaft synchronization is that the other shafts move in agreement with the terminal of the rate-determining shaft when a plurality of shafts moves. The auto-acceleration is that acceleration and deceleration value is controlled when the range of motion is small.

As shown in FIG. 5, the hold-and-guide member 44 is box-shaped to have a hollow interior. In the interior of the hold-and-guide member 44, a pair of guide rods 50a and 50b for guiding the lifting member 43 is perpendicularly provided on both end portions widthwise. Receiving plates 51a and 51b are fixed to the rear sides of the guide rods 50a and 50b, respectively. A ball screw 53 for moving up and down the lifting member 43 is perpendicularly provided at the center of the interior of the support guide member 44. The ball screw 53 is rotated through a belt (not shown) by a motor 57 provided on the bottom of the hold-and-guide member 44.

As shown in FIG. 3 and FIG. 4, a pair of connecting sections 43a and 43b, which project inwardly, is formed widthwise on both end sides of the base portion of the lifting member 43. A slit 47 (FIG. 4) is perpendicularly formed on the front surface of the hold-and-guide member 44 along the motion paths of the connecting sections 43a and 43b not to prevent the motion thereof when the lifting member 43 moves up and down. In the hold-and-guide member 44, the connecting sections 43a and 43b are connected to a plate member 48, which is provided to be parallel with the front and rear surfaces of the hold-and-guide member 44. Sliders 49a and 49b are attached to the backsides of both end portions of the plate member 48 widthwise. The guide rods 50a and 50b are inserted to these sliders 49a and 49b, respectively.

A ball 58 is inserted to the inserting portion in each of the sliders 49a and 49b. The ball 58 is the socalled over-ball whose size is larger than the space where the ball is inserted. The ball 58 presses to apply a pre-pressure to improve support force between the guide rods 50a and 50b and the sliders 49a and 49b.

A projection member 52, which projects backward, is provided at the center of the plate member 48. The projection member 52 is screwed with the ball screw 53. In other words, the motor 57 is driven to rotate the ball screw 53. Thereby, the guide rods 50a and 50b guide the lifting member 43 so as to be moved up and down.

As shown in FIGS. 3 and 5, a shield belt 54 is provided on the each of the connecting sections 43a and 43b of the lifting member 43 in up and down directions. The shield belt 45 has a function of shielding the slit 47. The shield belt 54 is wound around support rollers 55a and 55b and rollers 56a and 56b in a loop shape to be movable with the lifting member 43. The rollers 55a and 55b are provided on the front surface side of the upper end portion of the hold-and-guide member 44 and that of the lower end portion thereof. The rollers 56a and 56b are provided on the backward portions of the rollers 55a and 55b.

As shown in FIG. 5, the lifting member 43 is structured to become thinner as advancing to its top end side. Then, a motor 61 for rotating the base member 42 is provided at the lower central portion in a state in which its shaft is projected upwardly. A cylindrical coupling portion 66 is coupled to the top end portion of the lifting member 43 through a bearing 67. The base member 42 is fixed onto the coupling portion 66. A pulley 62 is attached to the shaft of the motor 61, and a belt 63 is wound around the pulley 62 and the lower end portion of the coupling portion 66. When the motor 61 is driven, the belt 63 and the base member 42 rotate in the horizontal plane through the coupling portion 66.

A base plate 70 is horizontally extended to the base member 42, and a motor 71 is provided on the lower surface of the end portion of the base plate 70. A pulley (not shown) is attached to the rotational shaft of the motor 71. On the other hand, at the upper portion of the base plate 70, pulleys 72 and 73 are provided at both end portions thereof, and a belt 76 is wound around the pulleys 72 and 73. The pulley 73 has two belt winding portions coaxially, and a belt 77 is wound around one winding portion. The belt 77 is also wound around the pulley of the motor 71. The substrate support member 41 and the belt 76 are coupled to each other by a coupling member (not shown). Therefore, when the motor 71 is driven, the substrate support member 41 moves back and forth on the base member 42 through the belts 77 and 76. In this case, a slider (not shown), that is provided in the substrate support member 41, runs on a rail 42a (FIG. 3) provided on the base member 42.

As shown in FIG. 5, in the base member 42, there is horizontally provided an exhaust path 74 toward the coupling portion 66 from the portion close to the motor arranging portion provided on the lower side of the base plate 70. The exhaust path 74 is communicated with the interior of the lifting member 43 through an inner space of the coupling portion 66. An exhaust fan 75 is provided at an entrance portion of the exhaust path 74, thereby allowing forcible exhaust.

On the other hand, in the lifting member 43, there is provided an exhaust path 64. The exhaust path 64 passes via the driving portion of the motor 61 and the connecting portion 43a from the connecting portion 66, and reaches the interior of the hold-and-guide member 44 through the plate member 48. In the vicinity of the motor 61 of the exhaust path 64, there is provided an exhaust fan 65, thereby allowing forcible exhaust.

On the bottom of the hold-and-guide member 44, there is provided an exhaust fan 59, thereby allowing the exhaust to the outside of the apparatus from the lower portion. In other words, forcible exhaust to the outside of the apparatus is performed via the exhaust path 74, the coupling portion 66, the exhaust path 64, and the interior of the hold-and-guide member 44.

In carrying the substrate G to the processing section 2 by the above-structured transferring apparatus 11, the hold-and-guide member 44 is moved along the carrying path 10a to rotate the base member 42, thereby placing the substrate support member 41 at a position corresponding to a predetermined cassette C. Then, the lifting member 43 is moved up and down to adjust the height of the substrate support member 41, so that the substrate support member 41 is moved forward to take up one substrate G. Next, the base member 42 is rotated to position the substrate support member 41 to be opposite to the processing section side. Then, the hold-and-guide member 44 is moved along the carrying path 10a, so that the substrate support member 41 is placed at a position corresponding to the carrying path 12. At this time, the main transferring apparatus 17 is moved to the end portion of the cassette station 1 of the carrying path 12. Then, the height of the substrate support member 41 is adjusted by the lifting member 43, and the substrate support member 41 is moved forward to transfer the substrate G to the main transferring apparatus 17.

In containing the substrate G, to which a series of processes have been provided, into the cassette by the transferring apparatus 11, the substrate support member 41 is directed to the processing section 2 to be set on standby at the position corresponding to the carrying path 12. When the substrate G is carried into the end portion of the cassette station side of the carrying path 12 by the main transferring mechanism 17, the substrate support member 41 is moved forward so as to receive the substrate G. Then, the base member 42 is rotated, and the hold-and-guide member 44 are moved along the carrying path 10a, and the substrate support member 41 on which the substrate G is mounted is made to correspond to the position of the predetermined cassette C. In this state, the lifting member 43 is moved up to adjust the height of the substrate support member 41. As a result, the substrate support member 41 is moved forward so as to contain substrate G in the cassette C.

In this case, the hold-and-guide member 44 supports the lifting member 43 in its single support state. As a result, unlike the conventional case in which the lifting member is guided by both sides, the base member 42 can be rotated without enlarging the size of the apparatus even if the hold-and-guide member 44 projects to the upper portion of the base member 42. Therefore, even if the height of the cassette is increased to deal with a warp of the substrate occurred when the substrate is enlarged, it is possible to deal with an increase in the motion strokes of the lifting member without providing addition work such as a formation of a hole since there is no limitation of the height of the hold-and-guide member 44.

Also, since pre-pressure is added by the ball 58 inserted to the insertion portion of the sliders 49a and 49b, support force using the guide rods 50a and 50b can be improved, and the large-sized substrate can be supported more safely in its single state. Moreover, since the lifting member 43 has a thick base end portion and becomes thinner as advancing to its top end side, the structure becomes stable.

The exhaust path is structured to have the exhaust path 74 of the base member 42, the inner space of the coupling portion 66, and the exhaust path 64 of the lifting member 43 continuously arranged. The exhaust fans 75 and 65 are provided close to the motors 71 and 61, respectively, to guide particles generated from the driving system to the hold-and-guide member 44 through the exhaust path, thereby forcibly exhausting particles to the outside of the apparatus. As a result, particles are prevented from being scattered to have unfavorable influence on the processing substrate G. Moreover, the slit 47 formed on the front surface of the hold-and-guide member 44 is shielded by the shield belt attached to the lifting member 43. As a result, the particles generated from the driving system of the hold-and-guide member 44 can be prevented from being scattered.

The present invention is not limited to the above-mentioned embodiment, and various modifications can be made. For example, the above embodiment explained the case in which the present invention was applied to the transferring apparatus between the cassette station 1 and the processing section 2. The present invention can be used as a transferring apparatus in an interface between the processing section 2 and an exposing unit. Moreover, the above-mentioned embodiment showed the example in which the present invention was used as the resist coating and developing unit. However, the present invention may be applied to the other process without limiting the above example. Also, the above-mentioned embodiment showed the case in which the LCD substrate was used as the substrate. However, it is needless to say that the present invention may be applied to the other substrate process without limiting this case.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate transferring apparatus for transferring a substrate to/from a substrate carrying in/out section that holds a plurality of cassettes substantially parallel to each other, each of the plurality of cassettes holding a plurality of substrates, the substrate transferring apparatus comprising:
   a substrate support member for supporting each of said substrates;
   a base member for holding said substrate support member which is horizontally movable;
   a lifting member, having one end and another end, for holding said base member at the one end such that said base member is rotatable in a horizontal plane, the lifting member being movable upward and downward;
   a hold-and-guide member for holding said lifting member at said another end and for guiding said lifting member when said lifting member is moved upward and downward; and
   a member for adding a pre-pressure provided in a holding portion of said hold-and-guide member that holds said lifting member.

2. The substrate transferring apparatus according to claim 1, wherein said hold-and-guide member is movable along a carrying path.

3. The substrate transferring apparatus according to claim 1, wherein said hold-and-guide member has a box shape having a guide portion for guiding said lifting member therein, said lifting member has a connecting member slidably connected to the guide portion, said hold-and-guide member has a front surface with a slit on which a connecting portion of said lifting member is movable, and said lifting member has a shield belt connected to said lifting member and integrally moving with said lifting member for shielding said slit.

4. A substrate transferring apparatus for transferring a substrate to and/or from a substrate carrying in/out section that holds a plurality of cassettes substantially parallel to each other, each of the plurality of cassettes holding a plurality of substrates, the substrate transferring apparatus comprising:
   a substrate support member for supporting the substrate;
   a base member for holding said substrate support member which is horizontally movable;
   a first driving mechanism, provided in said base member, for linearly driving said support member;
   a lifting member, having one end and another end, for supporting said base member at the one end such that said base member is rotatable in a horizontal plane, the lifting member being movable upward and downward;
   a second driving mechanism, provided in said lifting member, for rotably driving said base member;
   a hold-and-guide member for holding said lifting member at said another end and for guiding said lifting member when said lifting member is moved upward and downward;
   a third driving mechanism for driving upward and downward said lifting member; and
   a member for adding a pre-pressure provided in a holding portion of said hold-and-guide member that holds said lifting member.

5. The substrate transferring apparatus according to claim 4, further comprising:
   an exhaust path reaching to said hold-and-guide member from said base member through said lifting member; and
   exhausting means for forcibly exhausting particles generated from said first and second driving mechanisms through said exhaust path and said hold-and-guide member.

6. The substrate transferring apparatus according to claim 5, wherein said exhausting means has a first fan provided in said base member, a second fan provided in said lifting member, and a third fan provided in said hold-and-guide member.

7. The substrate transferring apparatus according to claim 4, wherein said hold-and-guide member is movable along a carrying path.

8. The substrate transferring apparatus according to claim 4, wherein said hold-and-guide member has a box shape having a guide portion for guiding said lifting member therein, said lifting member has a connecting member slidably connected to the guide portion, said hold-and-guide member has a front surface with a slit on which a connecting portion of said lifting member is movable, and said lifting member has a shield belt connected to said lifting member and integrally moving with said lifting member for shielding said slit.

9. A substrate processing apparatus for providing a predetermined process to a substrate to be processed, comprising:
   a processing section for providing the predetermined process to the substrate to be processed;

a substrate carrying in/out section that holds a plurality of cassettes substantially parallel to each other, each of the plurality of cassettes holding a plurality of substrates; and a substrate transferring apparatus for receiving and transferring the substrate between the substrate carrying in/out section and said processing section;

said substrate transferring apparatus comprising:

a substrate support member for supporting the substrate;

a base member for holding said substrate support member which is horizontally movable;

a lifting member, having one end and another end, for supporting said base member at the one end such that said base member is rotatable in a horizontal plane, the lifting member being movable upward and downward;

a hold-and-guide member for holding said lifting member at said another end and for guiding said lifting member when said lifting member is moved upward and downward; and a member for adding a pre-pressure provided in a holding portion of said hold-and guide member that holds said lifting member.

10. The substrate processing apparatus according to claim 9, wherein said hold-and-guide member is movable along a carrying path.

11. The substrate transferring apparatus according to claim 9, wherein said hold-and-guide member has a box shape having a guide portion for guiding said lifting member therein, said lifting member has a connecting member slidably connected to the guide portion, said hold-and-guide member has a front surface with a slit on which a connecting portion of said lifting member is movable, and said lifting member has a shield belt connected to said lifting member and integrally moving with said lifting member for shielding said slit.

12. A substrate processing apparatus for providing a predetermined process to a substrate to be processed, comprising:

a processing section for providing the predetermined process to the substrate to be processed;

a substrate carrying in/out section that holds a plurality of cassettes substantially parallel to each other, each of the plurality of cassettes holding a plurality of substrates; and a substrate transferring apparatus for receiving and transferring the substrate between the substrate carrying in/out section and said processing section;

said substrate transferring apparatus comprising:

a substrate support member for supporting the substrate;

a base member for holding said substrate support member which is horizontally movable;

a first driving mechanism, provided in said base member, for linearly driving said support member;

a lifting member, having one end and another end, for supporting said base member at the one end such that said base member is rotatable in a horizontal plane, the lifting member being movable upward and downward;

a second driving mechanism, provided in said lifting member, for rotably driving said base member;

a hold-and-guide member for holding said lifting member at said another end and for guiding said lifting member when said lifting member is moved upward and downward;

a third driving mechanism for driving upward and downward said lifting member; and a member for adding a pre-pressure provided in a holding portion of said hold-and-guide member that holds said lifting member.

13. The substrate processing apparatus according to claim 12, further comprising;

an exhaust path reaching to said hold-and-guide member from said base member through said lifting member; and exhausting means for forcibly exhausting particles generated from said first and second driving mechanisms through said exhaust path and said hold-and-guide member.

14. The substrate transferring apparatus according to claim 13, wherein said exhausting means has a first fan provided in said base member, a second fan provided in said lifting member, and a third fan provided in said hold-and-guide member.

15. The substrate processing apparatus according to claim 12, wherein said hold-and-guide member is movable along a carrying path.

16. The substrate transferring apparatus according to claim 12, wherein said hold-and-guide member has a box shape having a guide portion for guiding said lifting member therein, said lifting member has a connecting member slidably connected to the guide portion, said hold-and-guide member has a front surface with a slit on which a connecting portion of said lifting member is movable, and said lifting member has a shield belt connected to said lifting member and integrally moving with said lifting member for shielding said slit.

* * * * *